United States Patent [19]

Baker et al.

[11] Patent Number: 5,723,874

[45] Date of Patent: Mar. 3, 1998

[54] DISHING AND EROSION MONITOR STRUCTURE FOR DAMASCENE METAL PROCESSING

[75] Inventors: Faye Diann Baker, Burlington; Daniel Shaw Brooks, Essex Junction; Robert Kenneth Leidy, Burlington; Anne Elizabeth McGuire, Colchester; Rock Nadeau, Essex Junction, all of Vt.

[73] Assignee: International Business Machines Corporation, Armonk, N.Y.

[21] Appl. No.: 668,895

[22] Filed: Jun. 24, 1996

[51] Int. Cl.⁶ .......................... H01L 23/58; H01L 29/40
[52] U.S. Cl. .................... 257/48; 257/621; 324/671; 324/688; 371/22.5; 437/8; 437/974
[58] Field of Search .................. 257/48, 621; 324/671, 324/688; 371/22.5; 437/8, 974

[56] References Cited

U.S. PATENT DOCUMENTS

| | | | |
|---|---|---|---|
| 4,793,895 | 12/1988 | Kaanta et al. | 156/627 |
| 5,057,441 | 10/1991 | Gutt et al. | 437/8 |
| 5,081,421 | 1/1992 | Miller et al. | 324/671 |
| 5,234,868 | 8/1993 | Cote | 437/225 |
| 5,241,266 | 8/1993 | Ahmad et al. | 324/158 R |
| 5,265,378 | 11/1993 | Rostoker | 451/9 |
| 5,321,304 | 6/1994 | Rostoker | 257/621 |
| 5,337,015 | 8/1994 | Lustig et al. | 324/671 |
| 5,444,637 | 8/1995 | Smesny et al. | 364/556 |

Primary Examiner—Stephen Meier
Assistant Examiner—Allan R. Wilson
Attorney, Agent, or Firm—Schmeiser, Olsen & Watts; Howard Walter, Esq.

[57] ABSTRACT

According to the preferred embodiment, an erosion and dishing monitor is provided that facilitates the accurate optimization of a planarization process as in semiconductor process. The dishing monitor comprises at least two monitor structure sets embedded in a semiconductor substrate, the monitor structure sets comprising a plurality of monitor structures connected together with a plurality of connective conductors. The erosion monitor comprises a plurality of elongated conductors embedded into a semiconductor substrate, the plurality of conductors having varying conductor widths and adjacent substrate widths.

17 Claims, 3 Drawing Sheets

DISHING AND EROSION MONITOR STRUCTURE FOR DAMASCENE METAL PROCESSING

BACKGROUND OF THE INVENTION

1. Technical Field

This invention generally relates to semiconductor circuit fabrication, and more specifically relates to damascene metal processing.

2. Background Art

In semiconductor fabrication there is a constant need for methods to improve the reliability, yield and cost of fabrication. For this reason, the damascene metal deposition process was invented. Today, the damascene process is used for a variety of wiring and contacts in semiconductor fabrication, replacing the more expensive traditional reactive ion etch (RIE) metal processing in products such as CMOS memory and logic.

Single damascene is defined as where the damascene process is used for global wiring and interconnects only. Double damascene is where damascene wiring is combined with a damascene contact or via for even greater cost reduction.

The damascene metal process involves first etching a trench into a dielectric layer. The wafer is then covered with a conductor, this conductor filling the trench and covering the dielectric layer. The wafer is then polished, typically using a form of chemical mechanical polish (CMP), down to the, dielectric layer. The dielectric layer, typically an oxide, is not as easily polished away by the CMP as the metal. Thus, the oxide serves as a "stop" for the polish process. The CMP leaves the conductor embedded as wires in the dielectric. This process can be used to create global wiring, interconnects, contacts and vias. The damascene process has been Used extensively with tungsten as the conductor and silicon dioxide as the dielectric.

One of the key areas of concern in damascene processing is the optimization of the CMP, particularly the thickness and planarity of the conductor wires as determined by the CMP process. For example, for relatively large conductors made of tungsten, there is a problem of the CMP "dishing" the conductor. Dishing is non-planarity caused by accelerated polishing at the center of relatively large conductors. The oxide around the conductor serves as a stop for the CMP, but because the CMP "pad" is flexible, it will flex into the center portions of the conductor. Thus, dishing is primarily caused by deformation of the pad used during CMP.

Erosion is another potential problem that arises from CMP during damascene processing. Erosion occurs where there is insufficient oxide to act as a CMP stop. With insufficient oxide, the oxide can be thinned down by the CMP. With the oxide thinned, the conductor can be over-polished, resulting in conductors with insufficient thickness. Erosion is a particular problem in structures that have a high number of tightly packed conductors with small amounts of oxide between them.

Numerous variables determine the rate of dishing and erosion that occur in a CMP. For example, the size of the conductor pattern is a key feature. Also, the amount of dishing and erosion is determined by the density of fine metal features that have insufficient oxide available as a polish stop. In these local regions where there is more tungsten than oxide, the narrow oxide pillars will polish at a rapid rate, resulting in over polishing.

Other key variables are the particular methods used for the CMP. For example, a key variable is the selectivity of the tungsten polish to the underlying oxide, where selectivity is the ratio of tungsten to oxide polish rates. This selectivity is influenced by the chemistry of the slurry used as a polishing compound, the hardness of the oxide, and the physical tool conditions. Additionally, the slurry composition, the pressure of the polish head, the plate and carrier rotational speeds, and the pad hardness all play a role in this selectivity.

These variables can be adjusted to minimize the dishing and erosion to optimize the CMP for desired results. Unfortunately, one of the problems in achieving a well optimized CMP has been the difficulty in measuring the planarity and thickness of the resulting conductors, i.e., the amount of erosion and dishing. Without accurate measurements, it is very difficult to optimize the CMP.

Several methods have been used to quantify the resultant amount of metal thinning caused by dishing and erosion. For example, if the dishing is severe enough to break through the tungsten, then it can be seen optically. Otherwise, as a non-transparent film, it cannot be measured with standard film thickness measurement techniques that measure the thickness of transparent films.

Another method to measure the dishing and erosion in the past has been to use scanning electron microscope (SEM) cross-sections. This requires slicing the semiconductor wafer into cross sections and measuring the thickness of the conductor with an electron microscope. This is a very expensive and time consuming method and cannot be used for in-line, real-time optimization of the fabrication process.

Another method uses stylus dragging techniques for measuring changes in surface planarity. Unfortunately, this also gives limited data and is subject to other sensitivities including the effect of underlying topography.

Because of the inability to effectively optimize the CMP process, manufacturers have been forced to use a minimum amount of polishing. This is done by polishing a minimum amount and then visually inspecting the wafer. The under polished wafers show residuals that are visible in an optical microscope. The polish time is increased until no residuals are seen. Unfortunately, because it is possible that some dishing will occur before all the residuals are gone, this solution does not always lead to the optimum CMP process.

DISCLOSURE OF INVENTION

According to the present invention an erosion and dishing monitor is provided that facilitates the accurate optimization of planarizing process.

The dishing monitor comprises at least two monitor structure sets embedded in a semiconductor substrate, the monitor structure sets comprising a plurality of monitor structures connected together with a plurality of connective conductors.

The erosion monitor comprises a plurality of elongated conductors embedded into a semiconductor substrate, the plurality of conductors having varying conductor widths and surrounded by substrate of varying widths.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

A monitor structure and method according to the present invention is provided that facilitates the measurement of dishing and erosion in damascene metal processing. The monitor structure allows for dishing and erosion to be measured electrically using known conductivity relations. Thus, the monitor structure can provide in-line optimization of chemical mechanical polishing (CMP) used in damascene processing.

The monitor structure of the preferred embodiment is designed to electrically measure conductor thickness as a function of design features, such as a conductor size and density. The monitor can also measure defects (shorts and opens) simultaneously so that the full process window can be evaluated between under and over polish.

Figure 1:
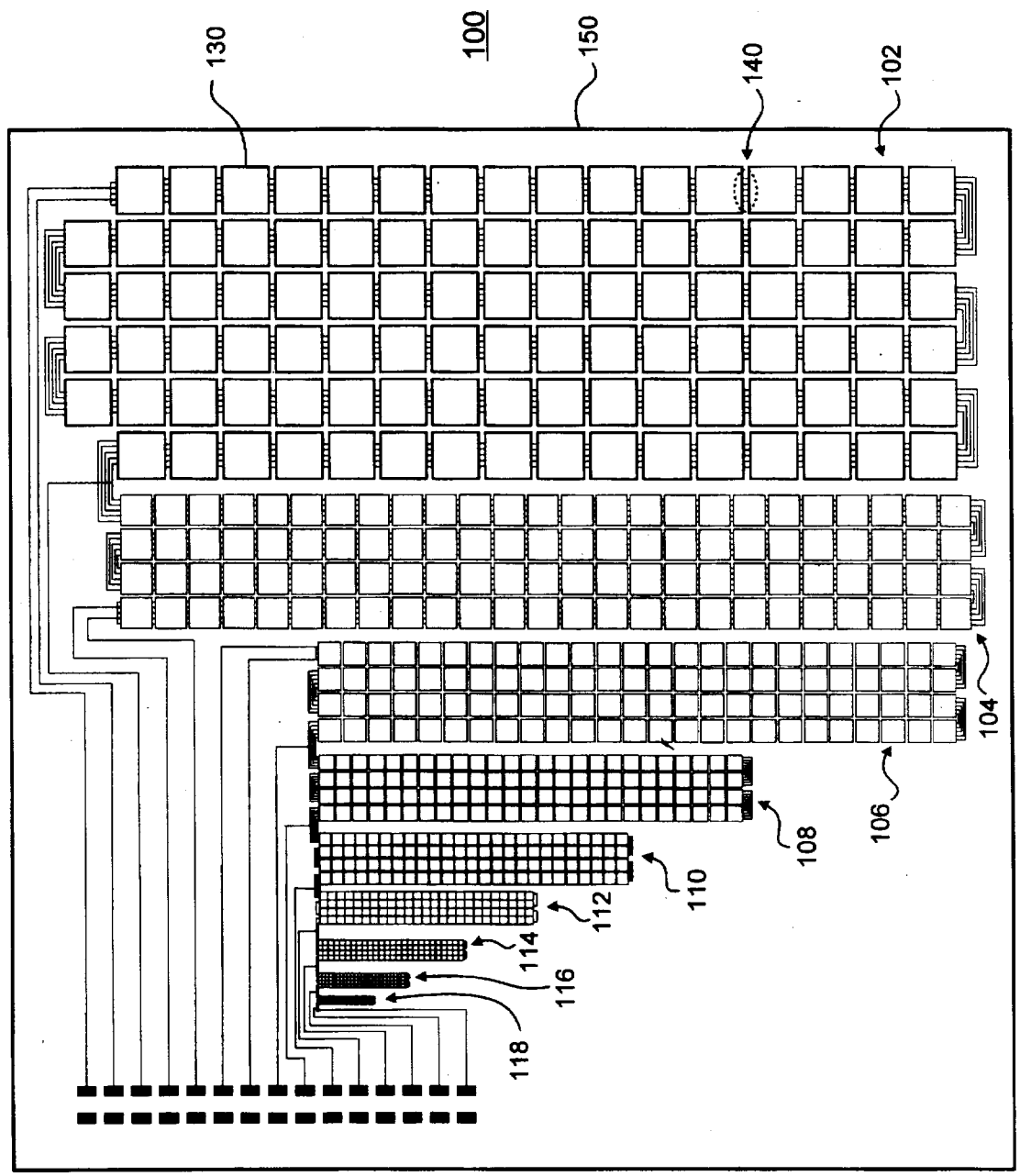
FIG. 1 is a schematic view of a dishing monitor in accordance with the preferred embodiment.

A schematic view of a dishing monitor 100 is illustrated in FIG. 1. The dishing monitor 100 consists of nine sets of dishing monitor structures 102, 104, 106, 108, 110, 112, 114, 116, and 118, each fabricated into a semiconductor substrate 150. Each set of dishing monitor structures comprises a plurality of monitor structures connected together in series. The monitor structures, and the connections to and between the monitor structures, are preferably created using a damascene metal process. In the most common usage of damascene metal process, the monitor structures are made as part of the first metal layer (M1).

The dishing monitor structures are designed to have a conductivity that is proportional to the amount of dishing occurring to the structure during CMP. Thus, by measuring the conductivity of the structures the amount of dishing can be determined.

In the preferred embodiment, each set of monitor structures comprise substantially identical rectangular metal regions having a predetermined length to width ratio between 0.20:1 and 5:1. In the illustrated embodiment, each set of monitor structures comprises an equal number of monitor squares, such as squares 130 in set 102. In the ideal case, the individual squares will all have the same uniform thickness and as such will have the same conductivity. The squares are connected together in series with five damascene conductors between squares.

Each set of monitor structures has an ideal conductivity defined as the set conductivity assuming a uniform depth (i.e., no dishing of the monitor structures). In the preferred embodiment, with the sets comprising an equal number of monitor squares, each set will have an equal ideal conductivity with no dishing present and uniform thickness. If the thickness of a set of monitor squares is decreased by dishing, the conductivity is decreased by a proportional amount. Thus, by measuring the conductivity of the sets, the amount of dishing created by the CMP as a function of element size can be determined.

The size of the squares is varied from set to set over a desired structure size range. Typically, the structure size range would be selected to correspond to the size of damascene conductors on actual semiconductor devices, such as global wiring, current buses and other metal structures fabricated on semiconductor devices. For example, in the illustrated embodiment, the set 102 comprises squares having 300 micron sides, while set 104 comprises 200 micron squares. Likewise, sets 106, 108, 110, 112, 114, 116 and 118 comprise squares having sides 150, 100, 75, 50, 30, 20 and 10 microns respectively. By measuring the conductivity of each set of squares after the CMP, the amount of dishing as a function of conductor size can be determined. Specifically, the thickness (and hence the amount of dishing) of the conductor is roughly proportional to the conductivity which is inversely proportional to the resistance. This information can be used to determine the appropriate parameters that should be used for CMP to optimize its process.

The preferred embodiment uses a plurality of thin conductors between the monitor structures in each set. For simplicity, the thin conductors are preferably made during the same damascene process that fabricates the monitor structures. In the illustrated embodiment, five damascene conductors, each 20 microns long, such as conductors 140, are used between squares (the conductors are not illustrated in all sets, nor illustrated to scale in FIG. 1 for clarity reasons). By using a plurality of thin conductors, the area between the squares is not prone to dishing. Thus, the integrity of the individual monitor squares is maintained. Additionally, by using five conductors of the same length between squares in all sets of the defect monitor, the effect on the conductivity of the small conductors is the same for each set, and hence cancels out.

In the preferred embodiment, a four-point probe method of measuring the conductivity is used. The four-point probe method uses a known current supplied to two contacts and two separate contacts for voltage measurement. By using a four-point probe, the conductivity can be accurately measured without the error due to contact resistance. Thus, by measuring the voltage after the current input the conductivity is accurately measured regardless of variations in conductivity caused by the current force contacts. This method increases the accuracy of the conductivity measurement and hence the dishing measurement.

To save on the number of contact pads used to connect the dishing monitor to the current sources and voltage meters, the sets of monitor structures are preferably "daisy chained" together into groups that share current sources. In the illustrated embodiment, the sets 102 and 104 are so daisy chained. Thus, the sets 102 and 104 are electrically connected together and there is a single current source and sink for the two sets, thus sharing a common current flow. The conductivity of the individual sets can be determined by measuring the voltage difference between nodes at both ends of the individual set.

Likewise, the sets 106, 108, 110, 112, 114, 116 and 118 are also daisy chained together such that they share a common current. Between each of these sets there is a voltage node, allowing the conductivity of each individual set to be determined accurately.

The dishing monitor 100 facilitates the measurement of the amount of dishing with simple conductivity measurements. Thus, the preferred embodiment enables the multiple dishing measurements with relative ease and accuracy. Conversely, in the prior art, the physical testing was inefficient and costly.

Another key problem area occurring during a CMP is erosion. The CMP is designed to polish down the damascene conductor to the top of the oxide. Thus, the oxide acts as a stop for the CMP. Ideally, the CMP will stop at the oxide and not polish any lower than the top of the oxide. Unfortunately, where a very dense structure exists (with lots of conductor and relatively little oxide), there may be insufficient oxide to act as a stop, and the oxide will be thinned by the CMP. This results in the conductor being overly thinned. This type of conductor thinning is known as erosion.

Figure 2:
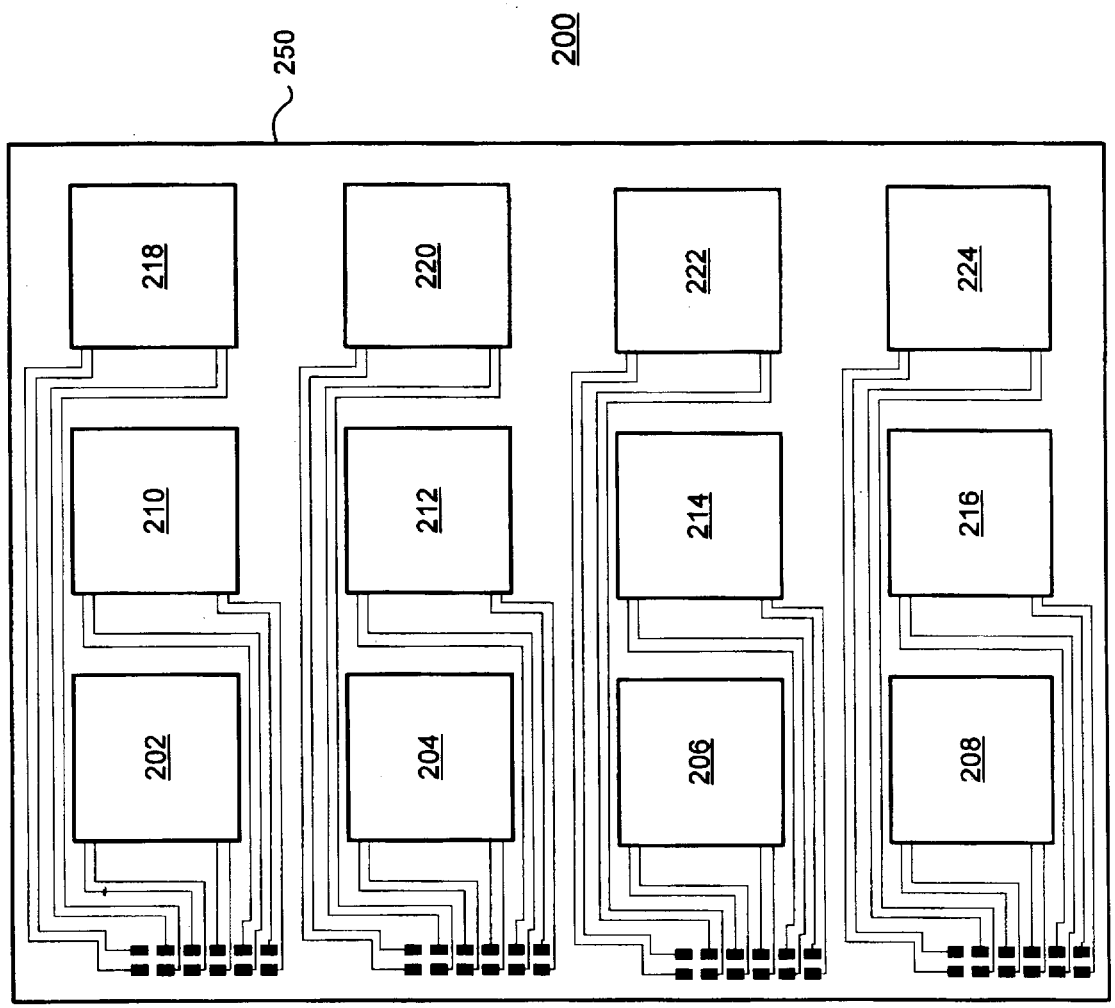
FIG. 2 is a schematic view of an erosion monitor in accordance with the preferred embodiment.

Turning now to FIG. 2, FIG. 2 is a schematic view of an erosion monitor 200 in accordance with the preferred embodiment. The erosion monitor 200 consists of twelve erosion monitor structures 202–224 fabricated into a semiconductor substrate 250, each having a different conductor pattern density. The erosion monitor structures facilitate the monitoring of erosion caused by the CMP using relatively simple conductivity measurements.

Figure 3:
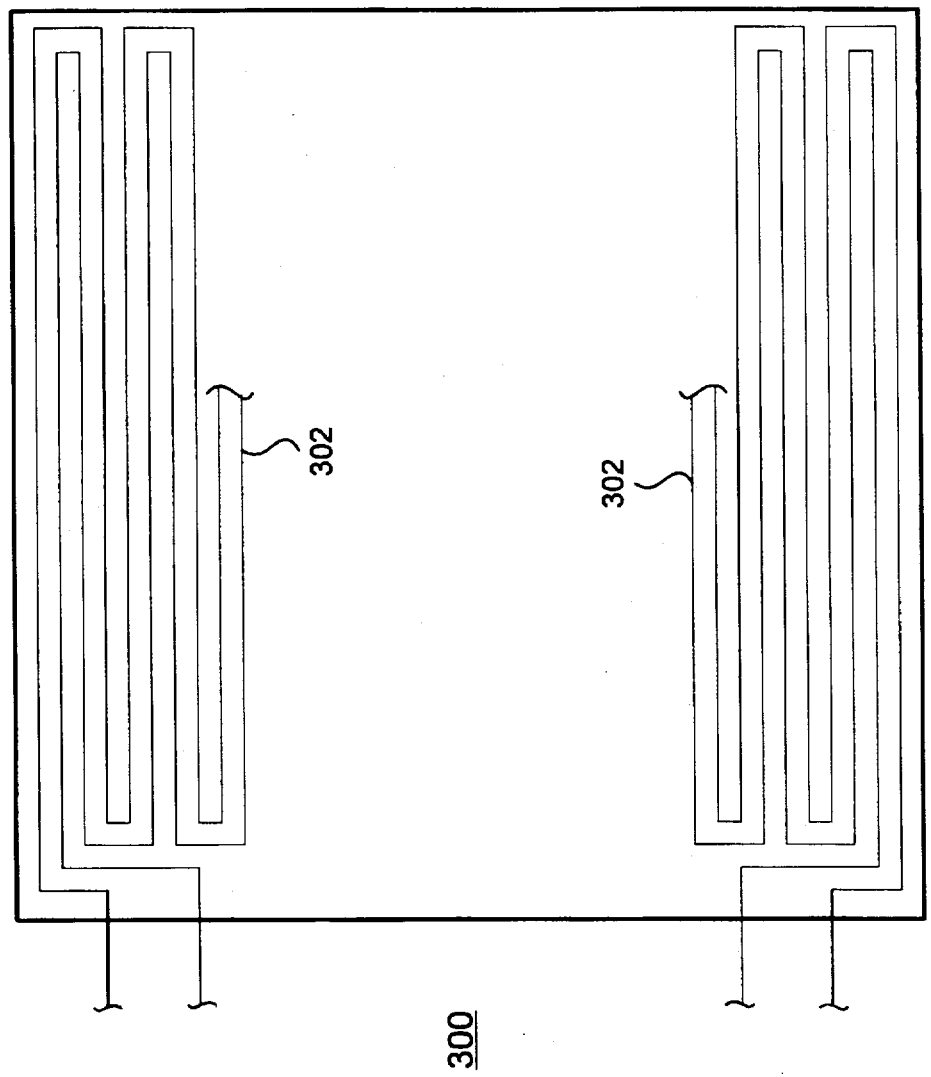
FIG. 3 is a schematic view of an erosion monitor structure with a intertwined serpentine conductor.

Each of the erosion monitor structures 202–224 comprise a densely packed elongated conductor such as an intertwined serpentine conductor, embedded in a semiconductor substrate. A single representative erosion monitor structure 300 is schematically illustrated in FIG. 3. The erosion monitor structure 300 includes twin serpentine conductors 302, a portion of which is illustrated in FIG. 3. Of course, the density of the serpentine conductors 302 is not shown to scale. In reality, the density of the serpentine conductors 302 is much higher than can be clearly illustrated.

Returning to FIG. 2, each of the erosion monitor structures 202–224 comprises twin intertwined serpentine conductors (as shown partially in FIG. 3) with a different wiring pitch and/or space ratio (where space ratio is defined as the ratio of oxide to wiring pitch). The ideal conductivity of the serpentine conductors, defined as the conductivity assuming uniform depth (i.e., no erosion), depends upon the length, width and ideal depth of the conductor.

The erosion monitor structures are designed with serpentine conductors having known length and width. With the length and width known, a conductivity measurement can be used to determine the depth of the conductor. The amount of erosion can then be determined by measuring the conductivity of the intertwined serpentine conductors. Thus, from a simple conductivity measurement, the thickness of the conductors in the various erosion monitors can be determined. This information can be used to optimize the CMP process to minimize erosion.

Twin intertwined serpentine conductors are used to test shorts and other defects with the erosion monitor test structure. Specifically, the twin conductors can be tested for shorts between the conductors using standard methods at the same time the conductivity is measured. Thus, the conductivity measurement can be used to find the distribution of defects, such as opens and shorts in addition to determining the amount of erosion occurring during the CMP.

Several different parameters effect a particular erosion monitor structure's propensity to erosion. These parameters include wiring pitch, space ratio, the width of the adjacent substrate (oxide width), conductor length and conductor width. In the preferred embodiment, the erosion monitor includes a plurality of monitor structures that have different parameters selected to effectively model actual production semiconductor devices. Thus, by measuring the erosion occurring in the monitor structures, the CMP process can be optimized to minimize erosion in the fabrication. These parameters of the preferred erosion monitor structures are shown in table 1.

TABLE 1

| Monitor Structure | Pitch | Space Ratio | Oxide Width | Wire Width | Wire Length |
|---|---|---|---|---|---|
| 202 | 2.0 µm | 60% | 1.2 µm | 0.8 µm | 1,246,564 µm |
| 204 | 2.0 µm | 50% | 1.0 µm | 1.0 µm | 1,246,428 µm |
| 206 | 2.0 µm | 40% | 0.8 µm | 1.2 µm | 1,246,292 µm |
| 208 | 2.0 µm | 30% | 0.6 µm | 1.4 µm | 1,246,157 µm |
| 210 | 1.8 µm | 61.1% | 1.1 µm | 0.7 µm | 1,378,329 µm |
| 212 | 1.8 µm | 50% | 0.9 µm | 0.9 µm | 1,378,179 µm |
| 214 | 1.8 µm | 38.9% | 0.7 µm | 1.1 µm | 1,378,029 µm |
| 216 | 1.4 µm | 57.1% | 0.8 µm | 0.6 µm | 1,773,559 µm |
| 218 | 1.6 µm | 62.5% | 1.0 µm | 0.6 µm | 1,561,364 µm |
| 220 | 1.6 µm | 50% | 0.8 µm | 0.8 µm | 1,561,194 µm |
| 222 | 1.6 µm | 37.5% | 0.6 µm | 1.0 µm | 1,561,024 µm |
| 224 | 1.4 µm | 42.9% | 0.6 µm | 0.8 µm | 1,773,366 µm |

Each monitor structure comprises twin intertwined serpentine conductors with a wiring pitch, a space ratio, a oxide width, a conductor length and conductor width. Thus, in the illustrated embodiment, erosion monitor structures 202–208 each have a 2.0 pitch and a space ratio from 60% to 30%. Likewise, monitor structures 210–214 have a 1.8 pitch and a space ratio from 61.1% to 39%. Additionally, monitor structures 218–222 have a 1.6 pitch and a space ratio from 62% to 38%. Finally, monitor structures 216 and 224 have a 1.4 pitch and a space ratio of 57% and 43% respectively.

Of course, this is one of many ways in which the parameters of the plurality of erosion monitors could be selected. For example, erosion monitors with smaller wiring pitch could be added for monitoring erosion on devices that have more densely packed conductor wires.

The conductivity is measured by applying a known current to the conductor and measuring the voltage. Because of the relatively high resistance of the serpentine conductors, a two-point probe conductivity measurement can be used without excessive error being introduced by contact resistance. However, the length of conductor to the structures and, in particular, the conductivity of the conductors should be accounted for to most accurately determine the rate of erosion.

Thus an apparatus has been disclosed that facilitates the accurate determination of dishing and erosion as a function of conductor size, length and density. The rate of dishing and erosion is determinable from simple conductivity measurements. Thus, the CMP used in a damascene metal process can be effectively optimized.

While the invention has been particularly shown and described with reference to preferred exemplary embodiments thereof, it will be understood by those skilled in the art that variations in form and detail may be made therein without departing from the spirit and scope of the invention.

We claim:

1. A monitor for characterizing the dishing occurring in a planarization process comprising:

a) a wafer;

b) a first monitor structure set embedded in said wafer, said first monitor structure set comprising a first plurality of monitor structures, said first plurality of monitor structures connected together in series with a first plurality of connective traces; and c) a second monitor structure set embedded in said wafer, said second monitor structure set comprising a second plurality of monitor structures, said second plurality of monitor structures having an area less than said first plurality of monitor structures and connected together in series with a second plurality of connective traces.

2. The monitor of claim 1 wherein said first plurality of monitor structures comprise substantially identical structures.

3. The monitor of claim 1 wherein said first plurality of monitor structures comprise substantially identical rectangular metal regions having a predetermined length to width ratio.

4. The monitor of claim 3 wherein said predetermined length to width ratio is in the range of 0.20:1 to 5:1.

5. The monitor of claim 1 wherein said first and second plurality of connective channels comprise a plurality of damascene connectors between each of said first and second plurality of monitor structures.

6. The monitor of claim 1 wherein said first and second plurality of monitor structures each comprise damascene deposited rectangular metal regions having equal predetermined length to width ratios.

7. The monitor of claim 1 wherein said first and second plurality of monitor structures comprise an equal number of monitor structures having the same number of conductivity squares.

8. The monitor of claim 1 wherein said first and second monitor structure set each include a current input and a voltage input such that conductivity is measurable using a four-point probe method.

9. The monitor of claim 1 wherein said first plurality of monitor structures has a predetermined ideal conductivity and wherein said second plurality of monitor structures has a predetermined ideal conductivity proportional to said predetermined conductivity for said first plurality of monitor structures.

10. A monitor for characterizing the erosion of a planarization process comprising:

a) a wafer;

b) a first erosion monitor embedded in said wafer, said first erosion monitor comprising at least one elongated conductor, said elongated conductor having a first predetermined width and a first width of adjacent portions of the wafer;

c) a second erosion monitor embedded in said wafer, said second erosion monitor comprising at least one elongated conductor, said elongated conductor having a second predetermined width and a second width of adjacent portions of the wafer.

11. The erosion monitor of claim 10 wherein said first and second elongated conductors comprise intertwined serpentine conductors.

12. The erosion monitor of claim 10 wherein said first and second elongated conductors comprise twin intertwined serpentine conductors.

13. The erosion monitor of claim 10 wherein said first and second elongated conductors have a predetermined ideal conductivity.

14. A monitor for characterizing the dishing of a planarization process comprising:

a wafer including a plurality of recessed regions in the surface of the wafer, said recessed regions comprising a first plurality of substantially identical rectangular subregions having a predetermined length to width ration of between about 0.20:1 and 5:1, each first subregion being connected to at least one other first subregion by a plurality of connective channels;

said recessed regions further comprising a second plurality of subregions, each second subregion having a predetermined length to width ration equal to that of the first subregions and being of a smaller area than said first subregions and each second subregion being connected to at least one other second subregion by a plurality of conductive channels.

15. The monitor of claim 14 wherein said recessed regions comprise regions etched into said wafer as part of a damascene deposition process.

16. A monitor for characterizing the erosion of a planarization process comprising:

a wafer including a plurality of recessed regions in the surface of the wafer, said recessed regions comprising a first subset of elongated recessed regions forming a first predetermined area percentage of recessed to non-recessed surface;

said recessed regions further comprising a second subset of elongated recessed regions having a different predetermined percentage of recessed to non-recessed surface.

17. The monitor of claim 16 wherein said recessed regions comprise regions etched into said wafer as part of a damascene deposition process.

* * * * *

UNITED STATES PATENT AND TRADEMARK OFFICE
CERTIFICATE OF CORRECTION

PATENT NO. : 5,723,874
DATED : March 3, 1998
INVENTOR(S) : Baker et al.

It is certified that error appears in the above-identified patent and that said Letters Patent is hereby corrected as shown below:

In column 7, lines 35-45 the text should read:

b) a first erosion monitor embedded in said wafer, said first erosion monitor comprising a first at least one elongated conductor, said first at least one elongated conductor comprising a first elongated conductor portion and a second elongated conductor portion, said first and second elongated conductor portions having a first predetermined width, said first and second elongated conductor portions separated by a first wafer portion having a first wafer portion width;

c) a second erosion monitor embedded in said wafer, said second erosion monitor comprising a second at least one elongated conductor, said second at least one elongated conductor comprising a first elongated conductor portion and a second elongated conductor portion, said first and second elongated conductor portions having a second predetermined width, said first and second elongated conductor portions separated by a second wafer portion having a second wafer portion width.

In column 8, lines 18 and 26, the word "channels" should read --traces--.

Signed and Sealed this

Twenty-eighth Day of July, 1998

Attest:

*Attesting Officer*

BRUCE LEHMAN

*Commissioner of Patents and Trademarks*